(12) United States Patent
Liu

(10) Patent No.: US 12,176,295 B2
(45) Date of Patent: Dec. 24, 2024

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Chao Wei Liu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 17/840,435

(22) Filed: Jun. 14, 2022

(65) Prior Publication Data
US 2022/0310521 A1 Sep. 29, 2022

Related U.S. Application Data

(63) Continuation of application No. 16/734,989, filed on Jan. 6, 2020, now Pat. No. 11,362,036.

(51) Int. Cl.
*H01L 23/538* (2006.01)
*H01L 21/48* (2006.01)
*H01L 21/56* (2006.01)
*H01L 23/00* (2006.01)
*H01L 23/31* (2006.01)
*H01L 25/16* (2023.01)

(52) U.S. Cl.
CPC ...... *H01L 23/5385* (2013.01); *H01L 21/4853* (2013.01); *H01L 21/561* (2013.01);
(Continued)

(58) Field of Classification Search
CPC .......... H01L 23/5385; H01L 23/3128; H01L 23/49838; H01L 23/49811; H01L 23/5383;
(Continued)

(56) References Cited

U.S. PATENT DOCUMENTS 8,975,726 B2 3/2015 Chen et al.
10,403,609 B2 * 9/2019 Geissler ............... H01L 24/19
(Continued)

FOREIGN PATENT DOCUMENTS

CN 101145558 A 3/2008
CN 107343376 A 11/2017
JP 2008-311267 A 12/2008

OTHER PUBLICATIONS

Final Office Action for U.S. Appl. No. 16/734,989, issued Nov. 22, 2021, 14 pages.
(Continued)

*Primary Examiner* — Kyoung Lee
*Assistant Examiner* — Christina A Sylvia
(74) *Attorney, Agent, or Firm* — FOLEY & LARDNER LLP

(57) ABSTRACT

A semiconductor device package and a method of manufacturing the same are provided. The semiconductor device package includes a first carrier, an encapsulant, a second carrier and one or more supporters. The first carrier has a first surface and a first side contiguous with the first surface. The encapsulant is on the first surface of the first carrier, and the first side of the first carrier is exposed from the encapsulant. The second carrier is disposed over the first carrier. The one or more supporters are spaced apart from the first side of the first carrier and connected between the first carrier and the second carrier. The one or more supporters are arranged asymmetrically with respect to the geographic center of the first carrier. The one or more supporters are fully sealed in the encapsulant.

19 Claims, 17 Drawing Sheets

(52) U.S. Cl.
CPC .......... *H01L 23/3128* (2013.01); *H01L 24/97* (2013.01); *H01L 25/16* (2013.01); *H01L 24/16* (2013.01); *H01L 2224/16225* (2013.01)

(58) Field of Classification Search
CPC ........... H01L 23/5386; H01L 23/49816; H01L 21/4853; H01L 21/561; H01L 24/97; H01L 24/16; H01L 25/16; H01L 25/071; H01L 2224/16225; H01L 2224/97; H01L 2224/16227; H01L 2924/15192; H01L 2924/1533; H01L 2924/15311; H01L 2924/19105; H01L 2924/3511
See application file for complete search history.

(56) References Cited

U.S. PATENT DOCUMENTS

| | | |
|---|---|---|
| 2004/0178499 A1 | 9/2004 | Mistry et al. |
| 2007/0170582 A1* | 7/2007 | Nomura ................ H05K 1/181 |
| | | 257/723 |
| 2007/0252255 A1 | 11/2007 | Lam |
| 2009/0085190 A1 | 4/2009 | Simon et al. |
| 2009/0315170 A1 | 12/2009 | Shim et al. |
| 2016/0260684 A1* | 9/2016 | Zhai .................... H01L 25/0652 |
| 2017/0263519 A1* | 9/2017 | Yu ......................... H01L 25/50 |
| 2017/0317059 A1 | 11/2017 | Besancon et al. |

OTHER PUBLICATIONS

Non-Final Office Action for U.S. Appl. No. 16/734,989, issued Jun. 3, 2021, 14 pages.
Notice of Allowance for U.S. Appl. No. 16/734,989, issued Feb. 16, 2022, 10 pages.
Office Action for corresponding Chinese Patent Application No. 202010249365.3, issued Oct. 29, 2024, 8 pages.
Search Report with English translation for corresponding Chinese Patent Application No. 202010249365.3, issued Oct. 29, 2024, 5 pages.

* cited by examiner

SEMICONDUCTOR DEVICE PACKAGE AND METHOD OF MANUFACTURING THE SAME

CROSS-REFERENCE TO RELATED APPLICATION

This application is a continuation of U.S. patent application Ser. No. 16/734,989 filed Jan. 6, 2020, the contents of which is incorporated herein by reference in its entirety.

TECHNICAL FIELD

The present disclosure relates to a semiconductor device package and, in particular, to a semiconductor device package including at least one supporter or free from any supporters and a method of manufacturing the semiconductor device package.

BACKGROUND

To address a trend towards miniaturization and increased functionality, a semiconductor device package can integrate multiple electronic devices on different substrates within the package by multi-side stacking (3D stacking), where the upper substrate and the lower substrate are interconnected through supporters or interposers. However, the supporters occupy certain areas of a substrate, which may place considerable constraint on available area for electronic components on the substrate of a semiconductor device package.

In light of the above, it is desirable to design a semiconductor device package with a limited number of supporters and simultaneously maintain the stability of the semiconductor device package.

SUMMARY

In accordance with some embodiments of the present disclosure, a semiconductor device package is provided. The semiconductor device package includes a first carrier, an encapsulant, a second carrier and one or more supporters. The first carrier has a first surface and a first side contiguous with the first surface. The encapsulant is on the first surface of the first carrier, and the first side of the first carrier is exposed from the encapsulant. The second carrier is disposed over the first carrier. The one or more supporters are spaced apart from the first side of the first carrier and connected between the first carrier and the second carrier. The one or more supporters are arranged asymmetrically with respect to the geographic center of the first carrier. The one or more supporters are fully sealed in the encapsulant.

In accordance with some embodiments of the present disclosure, a semiconductor device package is provided. The semiconductor device package includes a first carrier, a second carrier and an encapsulant. The first carrier has a first surface, a first side contiguous with the first surface, and a second side contiguous with the first surface. The second carrier is disposed over the first carrier. The encapsulant is between the first carrier and the second carrier and covers the first surface of the first carrier. Each of the first side and the second side of the first carrier is exposed from the encapsulant. The encapsulant is free from supporters.

In accordance with some embodiments of the present disclosure, a method of manufacturing a semiconductor device package is provided. The method includes: providing a first carrier having a first surface, the first carrier including a first sub-carrier and a second sub-carrier separable from each other along a scribing line; and providing supporters on the first surface of the first carrier, the supporters being spaced apart from the scribing line and arranged, sub-carrier wise, asymmetrically with respect to the geographic center each of the first sub-carrier and the second sub-carrier.

BRIEF DESCRIPTION OF THE DRAWINGS

Aspects of the present disclosure are readily understood from the following detailed description when read with the accompanying figures. It is noted that various features may not be drawn to scale, and the dimensions of the various features may be arbitrarily increased or reduced for clarity of discussion.

DETAILED DESCRIPTION

The present disclosure provides a semiconductor device package and a method for manufacturing the same. Embodiments of semiconductor device packages provide a low-profile package with decreased thickness. Moreover, the semiconductor device package of the present disclosure may reduce the number of supporters and thus reduce the space that would otherwise occupied by supporters in some comparative approaches. As a result, the semiconductor device packages of the present disclosure may accommodate more electronic components and simultaneously maintain the stability of the package structure. Furthermore, the semiconductor device package of the present disclosure may be free of any supporters. The supporters of the semiconductor device package of the present disclosure will not be cut, thereby avoiding the oxidation problem that would otherwise occur in some comparative approaches.

Figure 1A:
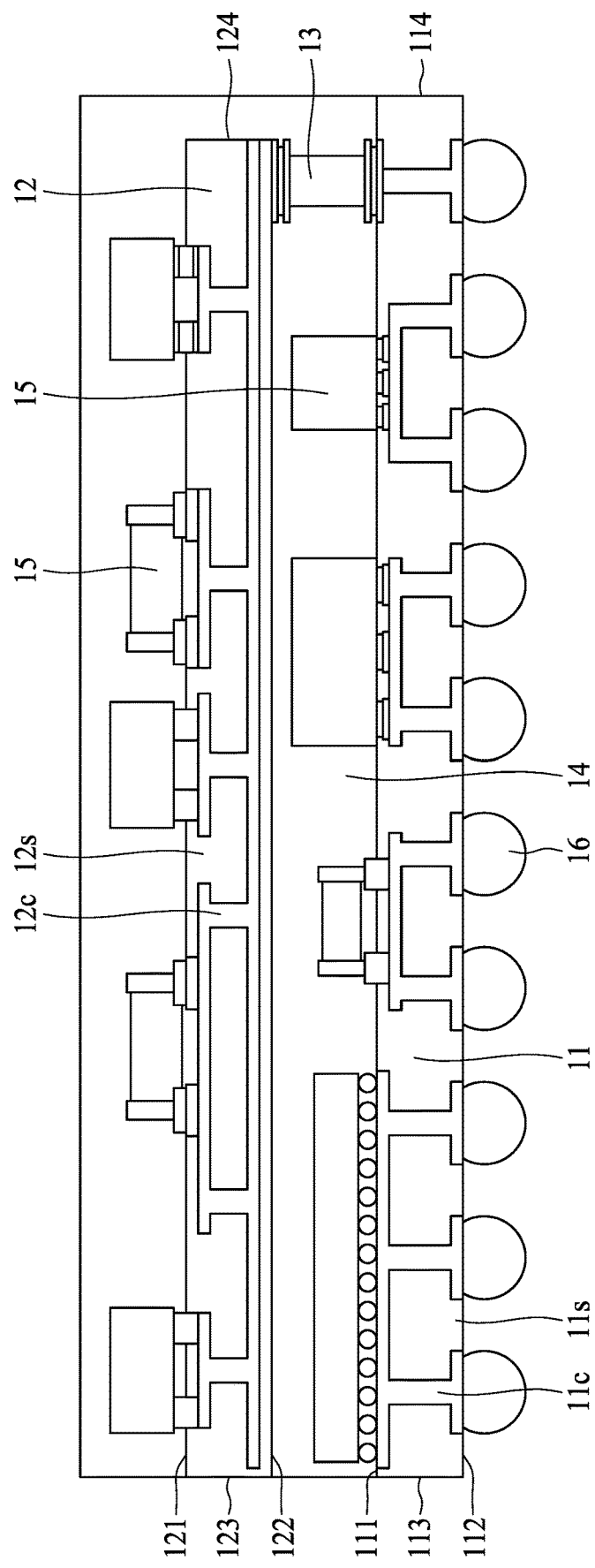
FIG. 1A illustrates a cross-sectional view of a semiconductor device package in accordance with an embodiment of the present disclosure.
Figure 1B:
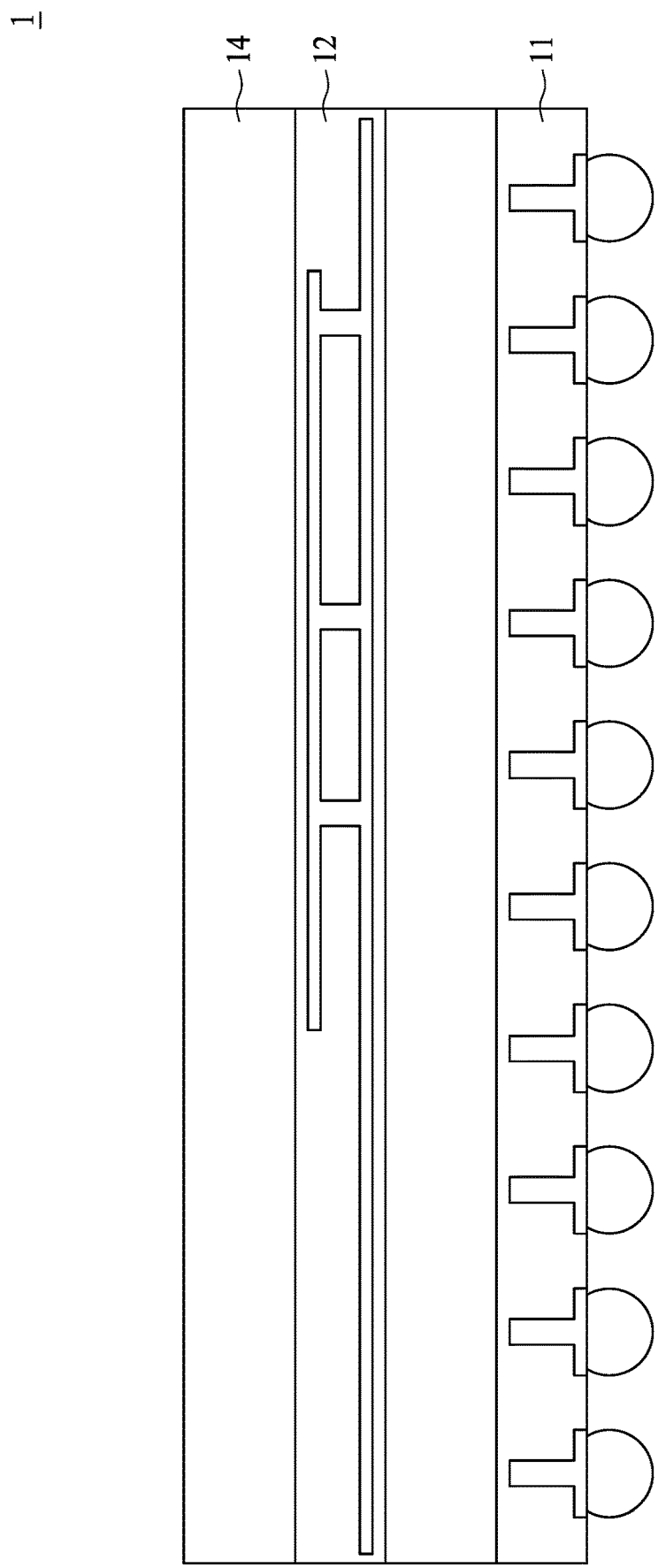
FIG. 1B illustrates a left-side view of the semiconductor device package in FIG. 1A.
Figure 1C:
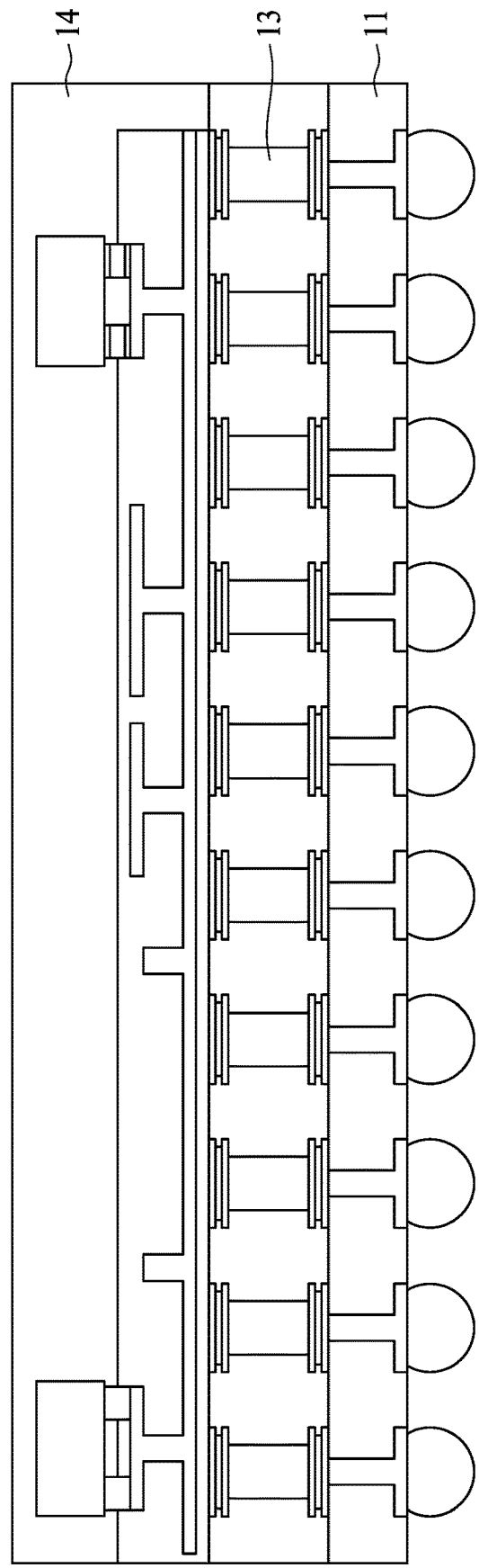
FIG. 1C illustrates a right-side view of the semiconductor device package in FIG. 1A.

FIG. 1A illustrates a cross-sectional view of a semiconductor device package 1 in accordance with some embodiments of the present disclosure. FIG. 1B illustrates a left-side view of the semiconductor device package 1 in accordance with some embodiments of the present disclosure. FIG. 1C illustrates a right-side view of the semiconductor device package 1 in accordance with some embodiments of the present disclosure.

Referring to FIGS. 1A, 1B and 1C, the semiconductor device package 1 includes a first carrier 11, a second carrier 12, one or more supporters 13, an encapsulant 14, one or more electronic components 15, and electrical contacts 16. The semiconductor device package 1 is, for example, applied to 2.5D/3D integration and assembly.

The first carrier 11 has an upper surface 111, a lower surface 112, a first side 113 and a second side 114 opposite to the first side 113. Both of the sides 113 and 114 are contiguous with the upper surface 111. Similarly, the second carrier 12 has an upper surface 121, a lower surface 122, a first side 123 and a second side 124 opposite to the first side 123. Both of the side 123 and the side 124 are contiguous with the upper surface 121. The second carrier 12 is disposed over the first carrier 11. The first side 113 of the first carrier 11 is flush with the first side 123 of the second carrier 12. The second side 114 of the first carrier 11 in the present embodiment is not flush with the second side 124 of the second carrier 12.

Each of the first carrier 11 and the second carrier 12 may comprise a substrate, a wafer, a printed circuit board, a panel, or the like. In some embodiments, the first carrier 11 can be referred to as a main board or a motherboard, while the second carrier 12 can be referred to as a sub-board or a daughter board.

In an embodiment, the first carrier 11 and the second carrier 12 may be substrates with one more layers of conductive traces or routing inside them. For example, the first carrier 11 may include a rigid substrate 11s with conductive traces 11c to which various components, one or more supporters (e.g., interposers), etc. may be connected. Similarly, the second carrier 12 may include a rigid substrate 12s with conductive traces 12c to which various components, one or more supporters (e.g., interposers), etc. may be connected. The conductive traces 11c, 12c may be contained entirely or partially within the rigid substrates 11s, 12s, and may also be formed on the upper surfaces 111, 121, respectively. The conductive traces 11c, 12c may be formed of suitable materials, such as copper, etc.

The supporters 13 may each comprise but are not limited to an interposer, a post, or a pillar, etc., depending on applications. The supporters 13 may have a cylindrical, tetragonal, or spherical shape. In order to facilitate electrical connections, the one or more supporters 13 may include at least one which is electrically connected between the first carrier 11 and the second carrier 12. In some embodiments, the one or more supporters 13 include at least one which has vias extending from a bottom side to a top side of the at least one supporter.

As shown in FIGS. 1A and 1C, the supporters 13 are disposed on the surface 111 of the first carrier 11 and connected between the upper surface 111 of the first carrier 11 and the lower surface 122 of the second carrier 12. The supporters 13 may be mounted on the first carrier 11 using surface mount technique (SMT).

The one or more supporters 13 are spaced apart from the first side 113 of the first carrier 11 and arranged asymmetrically with respect to the geographic center of either the first carrier 11 or the second carrier 12. As shown in FIGS. 1A and 1C, the supporters 13 include a row of supporters which are arranged on the first surface 111 along and near the second side 114 of the first carrier 11. As shown in FIGS. 1A and 1B, there are no supporters mounted along or near the first side 113 of the first carrier 11.

The plurality of electronic components 15 are disposed or mounted on the upper surface 111 of the first carrier 11 and/or the upper surface 121 of the second carrier 12 using, for example, SMT technology. Since no supporters are mounted along the first side 113 of the first carrier 11, the space between the first carrier 11 and the second carrier 12 for accommodating electronic components 15 is increased. That is, additional electronic components 15 can be mounted near the first side 113 of the first carrier 11.

The encapsulant 14 fully covers the one or more supporters 13 and electronic components 15. The encapsulant 14 covers at least a portion of the upper and lower surfaces 121, 122 of the second carrier 12. The encapsulant 14 covers at least a portion of the upper surface 111 of the first carrier 11. In this embodiment, the first sides 113 and the second 114 of the first carrier 11 and the first side 123 of the second carrier 12 are exposed from the encapsulant 14. The second side 124 of the second carrier 12 is sealed within the encapsulant 14.

The encapsulant 14 includes a material having a relatively low dielectric constant. In some embodiments, the encapsulant 14 includes an epoxy resin having fillers, a molding compound (e.g., an epoxy molding compound or other molding compound), a polyimide, a phenolic compound or material, a material with a silicone dispersed therein, or a combination thereof.

The electrical contact 16 (e.g. a solder ball) is disposed on the lower surface 112 of the first carrier 11 and electrically connected to the conductive traces 11c of the first carrier 11. The electrical contact 16 provides electrical connections between the semiconductor device package 1 and external components (e.g. external circuits or circuit boards). In some embodiments, the electrical contact 16 includes a controlled collapse chip connection (C4) bump, a ball grid array (BGA) or a land grid array (LGA).

Figure 2:
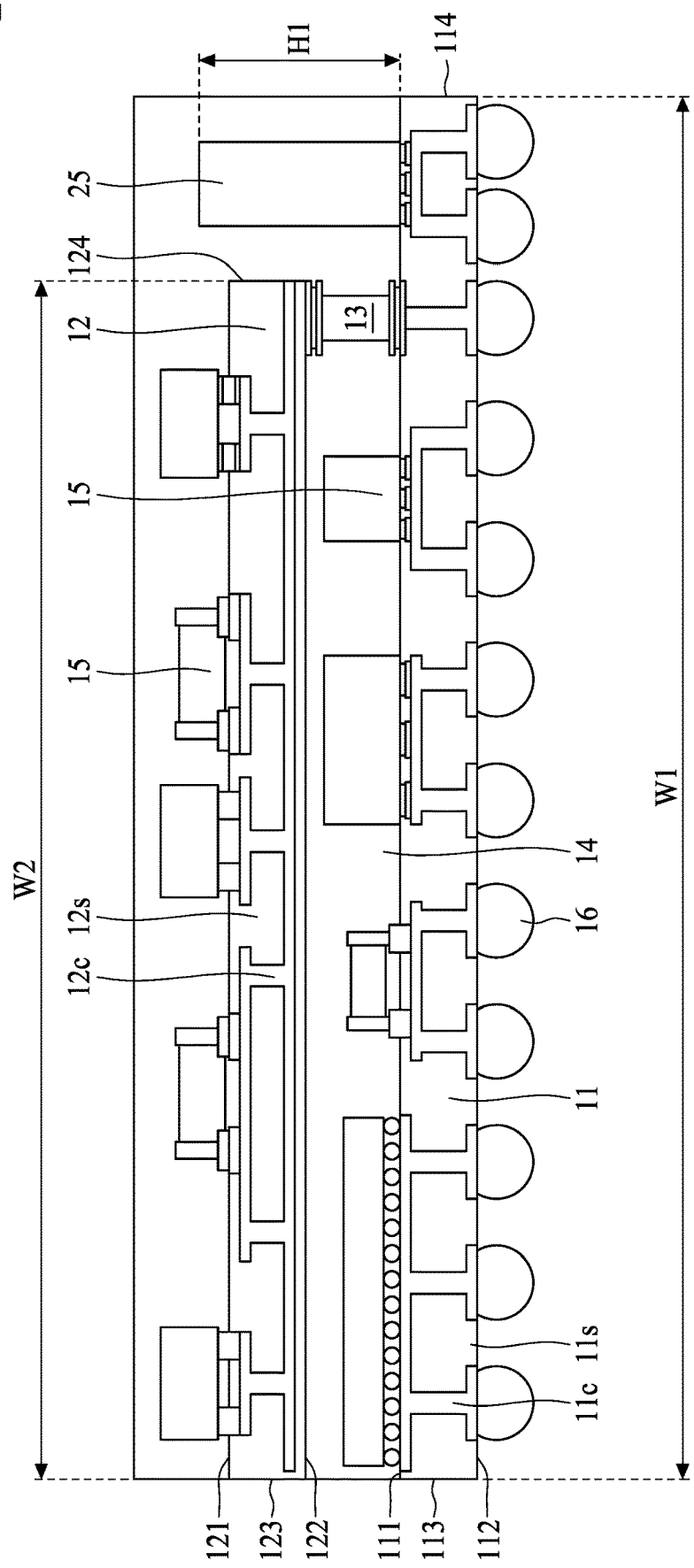
FIG. 2 illustrates a cross-sectional view of a semiconductor device package in accordance with another embodiment of the present disclosure.

FIG. 2 illustrates a cross-sectional view of a semiconductor device package 2 in accordance with some embodiments of the present disclosure.

Referring to FIG. 2, the semiconductor device package 2 includes a first carrier 11, a second carrier 12, one or more supporters 13, an encapsulant 14, one or more electronic components 15, and an electrical contact 16. The semiconductor device package 2 of FIG. 2 is similar to the semiconductor device package 1 of FIG. 1 except that, for example, the semiconductor device package 2 further includes an additional electronic component 25 mounted on the upper surface 111 of the first carrier 11.

As shown in FIG. 2, the width W2 of the second carrier 12 is shorter than the width W1 of the first carrier 11. As such, a portion of the upper surface 111 of the first carrier 11 is exposed from the second carrier 12. Therefore, the additional electronic component 25 can be mounted on the exposed portion of the upper surface 111 of the first carrier 11. That is, one or more electronic components can be mounted on the periphery of the first carrier 11 outside the one or more supporters 13. In this embodiment, the height H1 of the electronic component 25 is greater than the distance between the upper surface 111 of the first carrier 11 and the lower surface 122 of the second carrier 12. As a result, the semiconductor device package 2 of FIG. 2 is suitable for mounting one or more relatively tall electronic components on or around the periphery of first carrier 11 outside the one or more supporters 13.

Since the width W2 of the second carrier 12 is shorter than the width W1 of the first carrier 11, the one or more electronic components 15 can be mounted on the periphery of first carrier 11 outside the one or more supporters 13.

Figure 3:
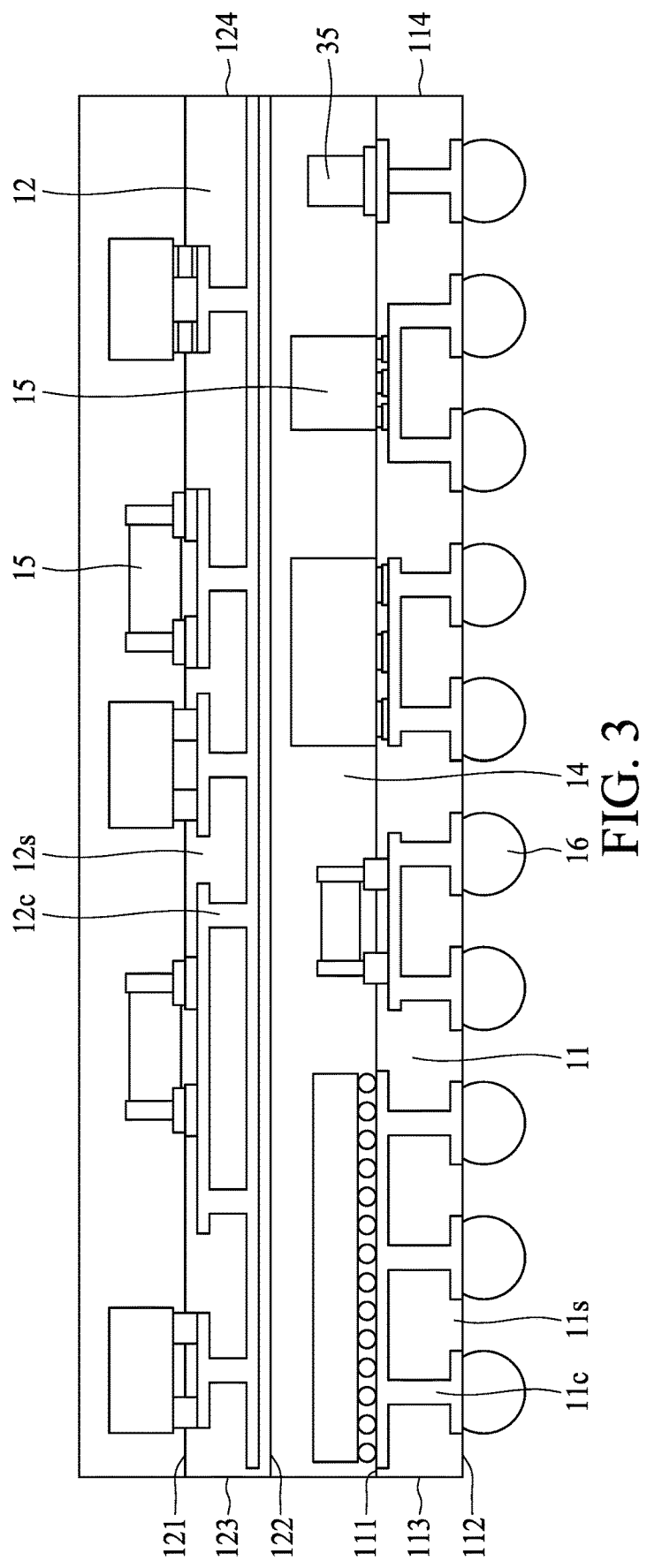
FIG. 3 illustrates a cross-sectional view of a semiconductor device package in accordance with yet another embodiment of the present disclosure.

FIG. 3 illustrates a cross-sectional view of a semiconductor device package 3 in accordance with some embodiments of the present disclosure.

Referring to FIG. 3, the semiconductor device package 3 includes a first carrier 11, a second carrier 12, an encapsulant 14, one or more electronic components 15, 35, and an electrical contact 16. A difference between the semiconductor device package 3 shown in FIG. 3 and the semiconductor device packages 1 and 2 shown in FIGS. 1 and 2 is that the encapsulant 14 of the semiconductor device package 3 is free from any supporters. The encapsulant 14, which is a relatively rigid layer, provides enough mechanical support between the first carrier 11 and the second carrier 12, and thus maintains the structural reliability.

In this embodiment, the first side 113 and the second side 114 of the first carrier 11 are exposed from the encapsulant 14. In addition, the first side 123 and the second 124 of the second carrier 12 are exposed from the encapsulant 14. The first side 123 of the second carrier 12 is flush with the first side 113 of the first carrier 11. Likewise, the second side 124 of the second carrier 12 is flush with the second side 114 of the first carrier 11. Since there are no supporters mounted on the upper surface 111 of the first carrier 11, more electronic components (e.g., an electronic component 35) can be mounted near the first side 113 and second side 114 of the first carrier 11.

FIG. 4A, FIG. 4B, FIG. 4C, FIG. 4D and FIG. 4E illustrate a method for manufacturing a semiconductor device package in accordance with some embodiments of the present disclosure. In some embodiments, the method in FIG. 4A, FIG. 4B, FIG. 4C, FIG. 4D and FIG. 4E may be used to manufacture the semiconductor device package 1 as shown in FIG. 1. In other embodiments, the method in FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M and FIG. 4N can be used to manufacture other semiconductor device package.

Figure 4A:
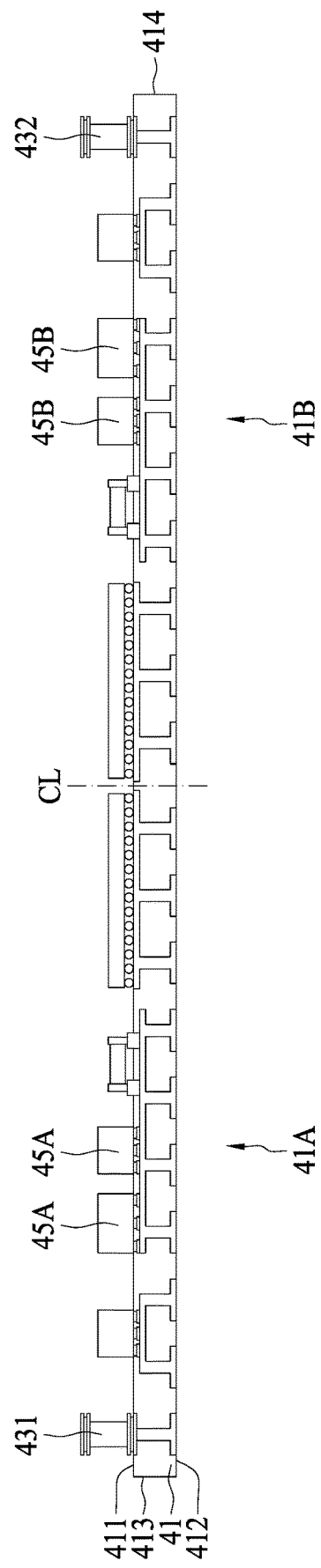
FIG. 4A, FIG. 4B, FIG. 4C, FIG. 4D and FIG. 4E illustrate a method for manufacturing a semiconductor device package in accordance with some embodiments of the present disclosure.

Referring to FIG. 4A, a first carrier 41 is provided. The first carrier 41 has an upper surface 411, a lower surface 412 opposite to the upper surface 411, a first side 4B, and a second side 414 opposite to the first side 413. The first carrier 41 includes a sub-carrier 41A and a sub-carrier 41B which are separable from each other along a scribing line CL.

After the first carrier 41 is provided, a set of electronic components 45A, 45B are mounted on the upper surface 411 of the first carrier 41 by using bonding (e.g., SMT) technology. The set of electronic components 45A, 45B includes a first subset of electronic components 45A and a second subset of electronic components 45B corresponding in position to the sub-carrier 41A and the sub-carrier 41B of the first carrier 41, respectively.

After the first carrier 41 is provided, one or more supporters 431, 432 are mounted on the upper surface 411 of the first carrier 41 by using bonding (e.g., SMT) technology. As shown in FIG. 4A, the supporters 431, 432 are spaced apart from the scribing line CL and arranged, sub-carrier wise, asymmetrically with respect to the geographic center of each of the sub-carrier 41A and the sub-carrier 41B.

Figure 4B:
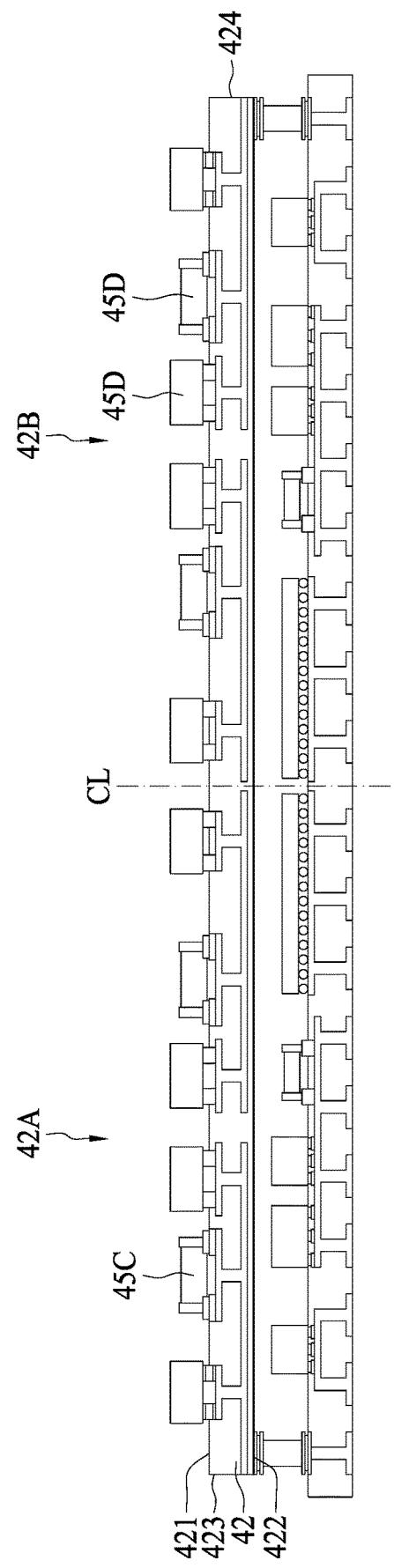

Referring to FIG. 4B, after the supporters 431, 432 are mounted, a second carrier 42 is attached over the first carrier 41. The second carrier 42 is stacked on the supporters 431, 432. The supporters 431, 432 define a space between the first carrier 41 and the second carrier 42 for accommodating the first subset of electronic components 45A and the second subset of electronic components 45B.

The second carrier 42 has an upper surface 421, a lower surface 422 opposite to the upper surface 421, a first side 423, and a second side 424 opposite to the first side 423. The second carrier 42 includes a sub-carrier 42A and a sub-carrier 42B which are separable from each other along the scribing line CL. The sub-carriers 42A and 42B of the second carrier 42 correspond in position to the sub-carriers 41A and 41B of the first carrier 41, respectively.

Before the second carrier 42 is stacked on the supporters 431, 432, a set of electronic components 45C, 45D are mounted on the upper surface 421 of the second carrier 42 by using bonding (e.g. SMT) technology. The set of electronic components 45C, 45D includes a first subset of electronic components 45C and a second subset of electronic components 45D corresponding in position to the sub-carrier 42A and the sub-carrier 42B of the first carrier 42, respectively.

Figure 4C:
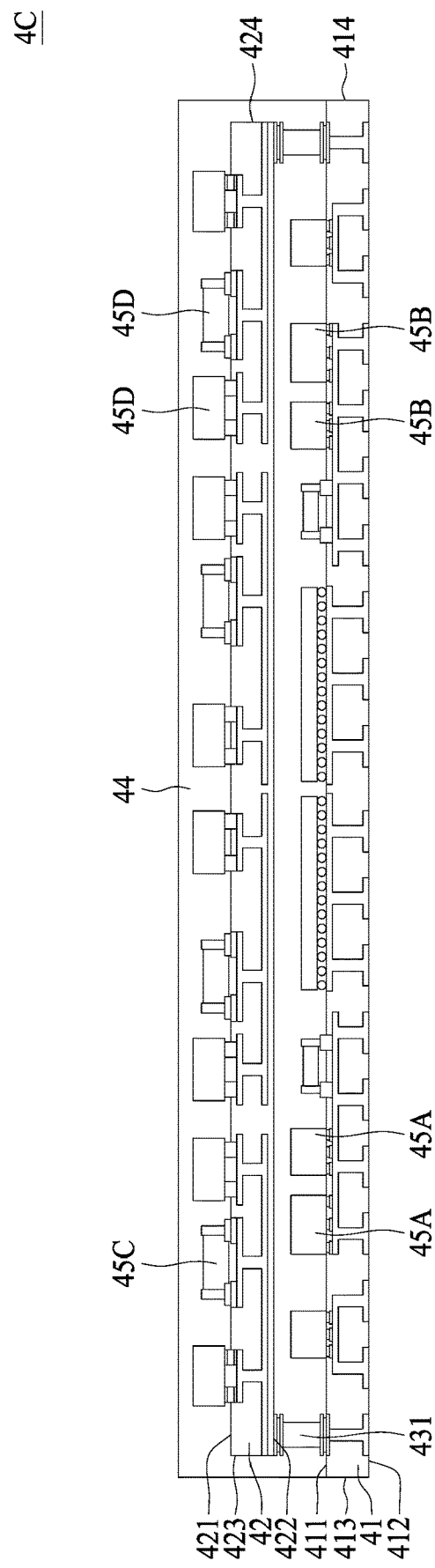

Referring to FIG. 4C, after the second carrier 42 is stacked on the supporters 431, 432, at least a portion of the first carrier 41, the second carrier 42, the electronic components 45A, 45B, 45C and 45D, and the supporters 431, 432 are encapsulated by an encapsulant 44 to form an encapsulated semiconductor device stack 4C. The encapsulant 14 may be formed by molding techniques, such as transfer molding, compression molding or any other suitable processes.

The supporters 431, 432 are fully sealed by the encapsulant 44. The sides 423, 424 of the second carrier 42 are fully sealed by the encapsulant 44, whereas the sides 413, 414 of the first carrier 41 are exposed from the encapsulant 44. In the present embodiment, the first side 423 of the second carrier 42 is not flush with the first side 413 of the first carrier 41. In addition, the second side 424 of the second carrier 42 is not flush with the second side 414 of the first carrier 41. The width of the sub-carrier 42A of the second carrier 42 is shorter than the width of the sub-carrier 41A of the first carrier 41, so a portion of the upper surface 411 of sub-carrier 41A is exposed from the sub-carrier 42A, which facilitate flowing of the encapsulant 44 into the space between the first carrier 41 and the second substrate 42. Similarly, the width of the sub-carrier 42B of the second carrier 42 is shorter than the width of the sub-carrier 41B of the first carrier 41, so a portion of the upper surface 411 of the sub-carrier 41B is exposed from the sub-carrier 42B, which facilitate flowing the encapsulant 44 into the space between the first carrier 41 and the second substrate 42.

Figure 4D:
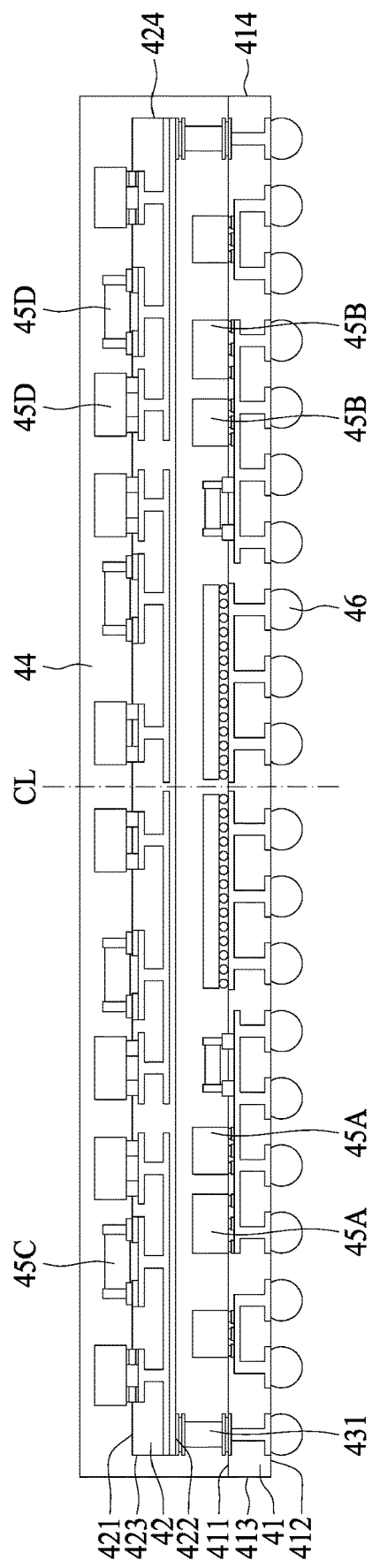

Referring to FIG. 4D, a plurality of electrical contacts 46 are attached on the lower surface 412 of the first carrier 41 to form the encapsulated semiconductor device stack 4D. In some embodiments, the electrical contacts 46 include a C4 bump, a BGA or a LGA.

Figure 4E:
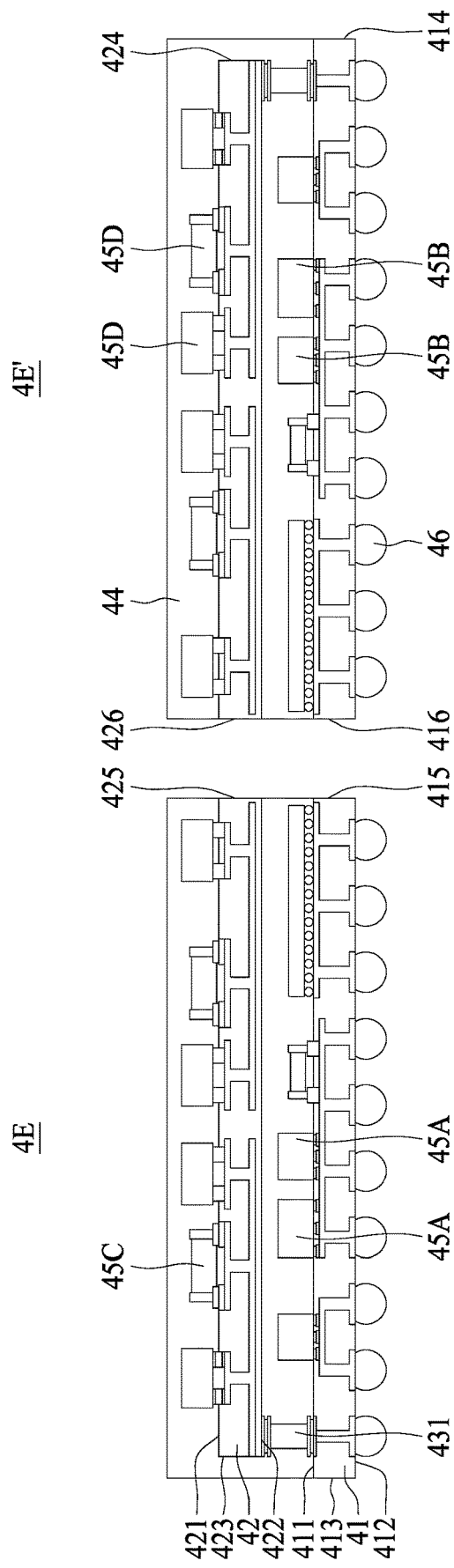

Referring to FIG. 4E, after the electrical contacts 46 are attached, the encapsulated semiconductor device stack 4D (including the first carrier 41, the second carrier 42 and the encapsulant) is cut, by e.g., laser or blade sawing technology, along the scribing line CL to form the semiconductor device packages 4E and 4E'.

Specifically, the semiconductor device package 4E includes the sub-carrier 41A of the first carrier 41, the sub-carrier 42A of the second carrier 42, the electronic components 45A, 45C and the supporter 431. The sub-carrier 41A of the first carrier 41 includes a side 415, which is opposite to the side 413 and exposed from the encapsulant 44. The sub-carrier 42A of the second carrier 42 includes a side 425 which is opposite to the side 423 and exposed from the encapsulant 44. The side 415 of the sub-carrier 41A is flush with the side 425 of the sub-carrier 42A.

The semiconductor device package 4E' includes the sub-carrier 41B of the first carrier 41, the sub-carrier 42B of the second carrier 42, the electronic components 45B, 45D and the supporter 432. The sub-carrier 41B of the first carrier 41 includes a side 416 which is opposite to the side 414 and exposed from the encapsulant 44. The sub-carrier 42B of the second carrier 42 includes a side 426 which is opposite to the side 424 and exposed from the encapsulant 44. The side 416 of the sub-carrier 41B is flush with the side 426 of the sub-carrier 42B.

In order to better understand how to dispose the supporters in an asymmetrical manner with respect to the geographic center each of the first sub-carrier and the second sub-carrier, several examples are provided below to illustrate the arrangement of the supporters. For simplicity, the electronic components and an encapsulant are not shown in the following examples.

Figure 5:
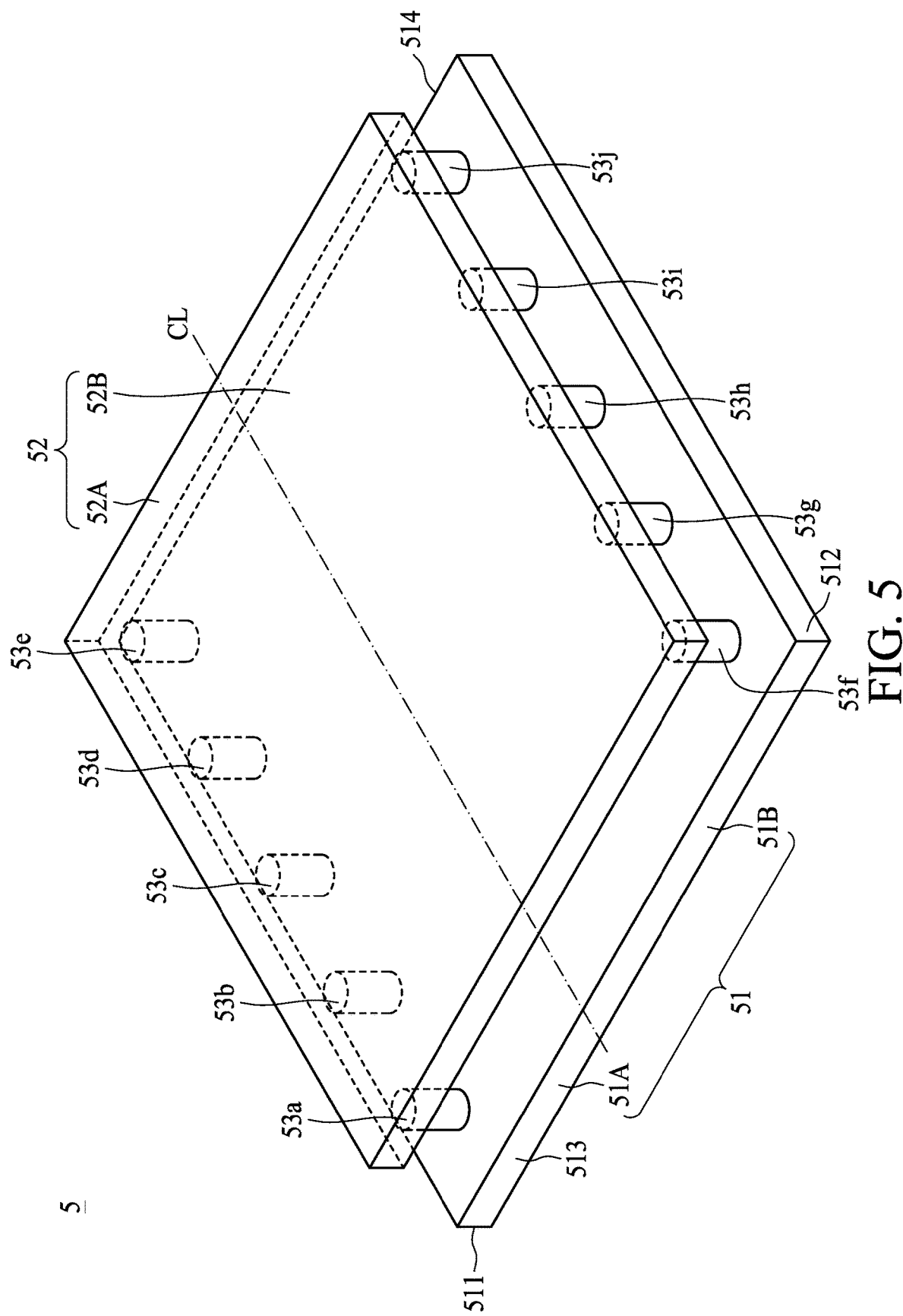
FIG. 5 illustrates a perspective view of a semiconductor device stack in accordance with an embodiment of the present disclosure.

FIG. 5 illustrates a perspective view of a semiconductor device stack 5 in accordance with some embodiments of the present disclosure.

Referring to FIG. 5, the semiconductor device stack 5 includes a first carrier 51, a second carrier 52, and a plurality of the supporters 53a, 53b, 53c, 53d, 53e, 53f, 53g, 53h, 53i, 53j. The first carrier 51 includes a sub-carrier 51A and a sub-carrier 51B. The sub-carrier 51A and the sub-carrier 51B are separable from each other along a scribing line CL. The second carrier 52 includes a sub-carrier 52A and a sub-carrier 52B. The sub-carrier 52A and the sub-carrier 52B are separable from each other along the scribing line CL. The supporters 53a, 53b, 53c, 53d and 53e, arranged in a first row, are mounted on the sub-carrier 51A along a side 511 of the first carrier 51. The first row of supporters 53a, 53b, 53c, 53d and 53e extends in parallel with the scribing line CL. The supporters 53f, 53g, 53h, 53i and 53j, arranged in a second row, are mounted on the sub-carrier 51B along a side 512 of the first carrier 51. The second row of supporters 53f, 53g, 53h, 53i and 53j extends in parallel with the scribing line CL. In some embodiments, the supporters 53f, 53g, 53h, 53i and 53j are without cutting during the process of separating the sub-carrier 51A from the sub-carrier 51B along the scribing line CL.

In some other embodiments, the first row of interposers may be mounted on both of the sub-carrier 51A and the sub-carrier 51B along the side 513 of the first carrier 51. The first row of supporters extends across the scribing line CL, but they are spaced apart from the scribing line CL (e.g., these supporters are not arranged on the scribing line CL). Similarly, the second row of supporters may be mounted on both of the sub-carrier 51A and the sub-carrier 51B along the side 514 of the first carrier 51. The second row of supporters extends across the scribing line CL, but they are spaced apart from the scribing line CL (e.g., these supporters are not arranged on the scribing line CL).

Figure 6:
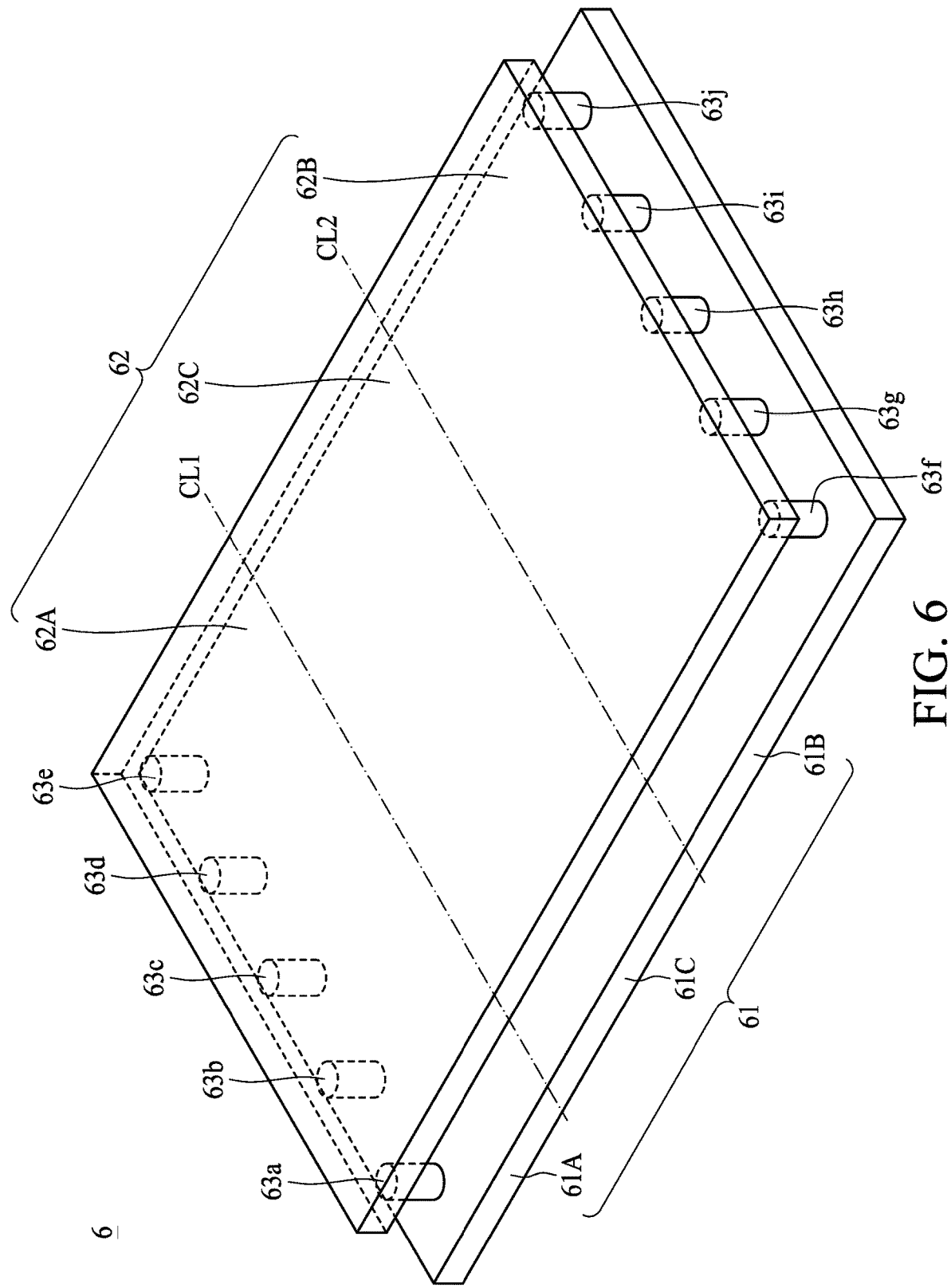
FIG. 6 illustrates a perspective view of a semiconductor device stack in accordance with another embodiment of the present disclosure.

FIG. 6 illustrates a perspective view of a semiconductor device stack 6 in accordance with some embodiments of the present disclosure.

Referring to FIG. 6, the semiconductor device stack 6 includes a first carrier 61, a second carrier 62, and a plurality of the supporters 63a, 63b, 63c, 63d, 63e, 63f, 63g, 63h, 63i, 63j. The first carrier 61 includes a sub-carrier 61A, a sub-carrier 61B and a sub-carrier 61C. The second carrier 62 includes a sub-carrier 62A, a sub-carrier 62B and a sub-carrier 62C. The stack 6 in FIG. 6 is similar to the stack 5 in FIG. 5 except that, for example, the stack 6 can be divided into three parts along a first scribing line CL1 and a second scribing line CL2.

After the stack 6 is separated or divided, the first part of the stack 6 includes the sub-carrier 61A, the sub-carrier 62A and a first row of interposers 63a, 63b, 63c, 63d and 63e. The second part of the stack 6 includes the sub-carrier 61B, the sub-carrier 62B and a second row of interposers 63f, 63g, 63h, 63i and 63j. The third part of the stack 6 includes the sub-carrier 61C and the sub-carrier 62C and is free from supporters.

Figure 7:
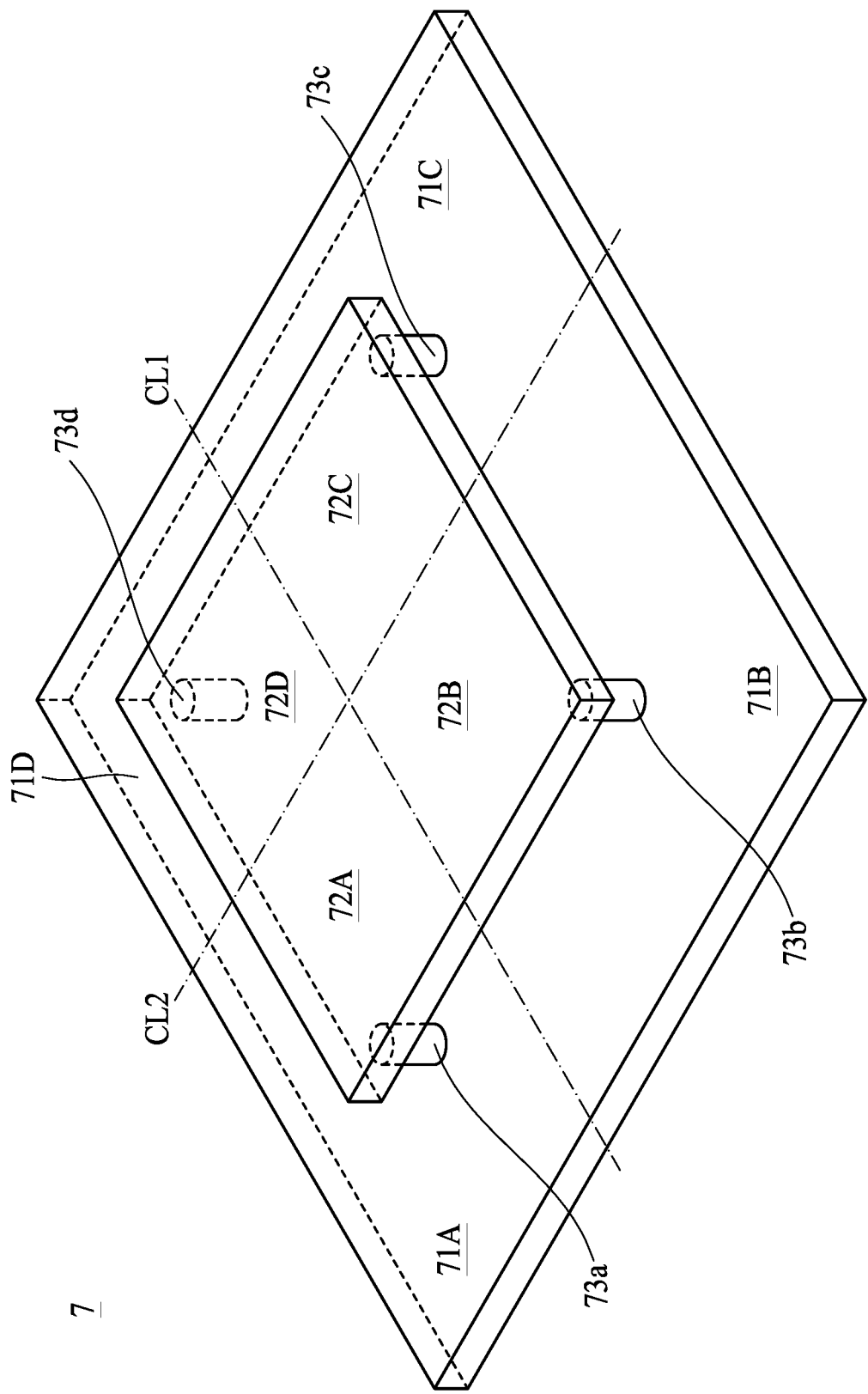
FIG. 7 illustrates a perspective view of a semiconductor device stack in accordance with yet another embodiment of the present disclosure.

FIG. 7 illustrates a perspective view of a semiconductor device stack 7 in accordance with some embodiments of the present disclosure.

Referring to FIG. 7, the semiconductor device stack 7 includes a first carrier 71, a second carrier 72, and a plurality of the supporters 73a, 73b, 73c and 73d. The first carrier 71 includes a sub-carrier 71A, a sub-carrier 71B, a sub-carrier 71C and a sub-carrier 71D. The second carrier 72 includes a sub-carrier 72A, a sub-carrier 72B, a sub-carrier 72C and a sub-carrier 72D. The supporters 73a, 73b, 73c and 73d are mounted on the sub-carrier 71A, 71B, 71C and 71D, respectively. The positions of the supporters 73a, 73b, 73c and 73d correspond to four corners of the second carrier 72.

Figure 8A:
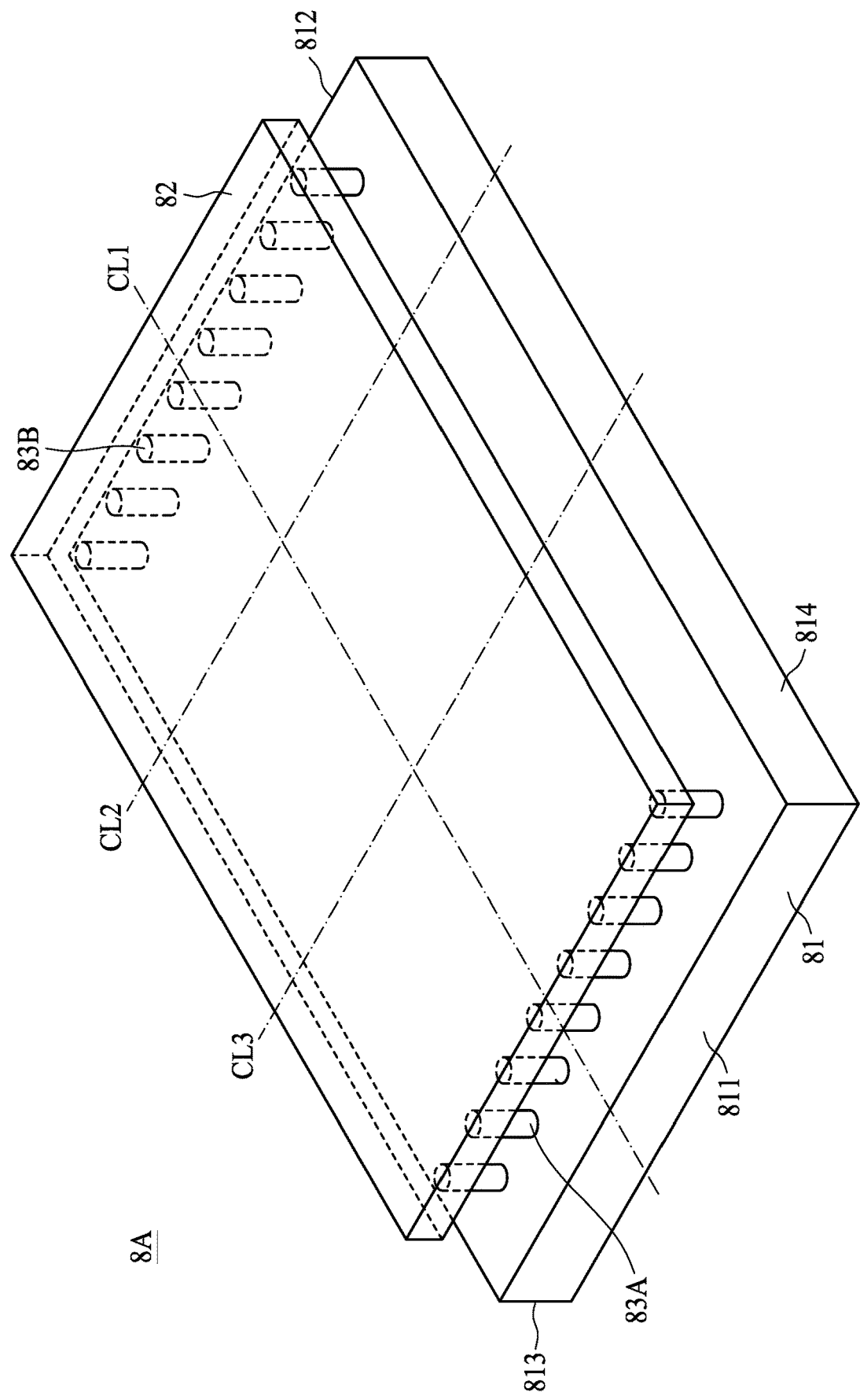
FIG. 8A illustrates a perspective view of a semiconductor device stack in accordance with still another embodiment of the present disclosure.

FIG. 8A illustrates a perspective view of a semiconductor device stack 8A in accordance with some embodiments of the present disclosure.

The semiconductor device stack 8A includes a first carrier 81, a second carrier 82, a first row of supporters 83A and a second row of supporters 83B. The first row of supporters 83A is mounted along a side 811 of the first carrier 81. The first row of supporters 83A extends in parallel with the scribing lines CL2 and CL3 and across the scribing line CL1. The second row of supporters 83B is mounted along another side 812 opposite to the side 811 of the first carrier 81. The second row of supporters 83B extends in parallel with the scribing lines CL2 and CL3 and across the scribing line CL1. When the semiconductor device stack 8 is divided into six parts along the scribing lines CL1, CL2 and CL3, the middle two parts are free from supporters.

Figure 8B:
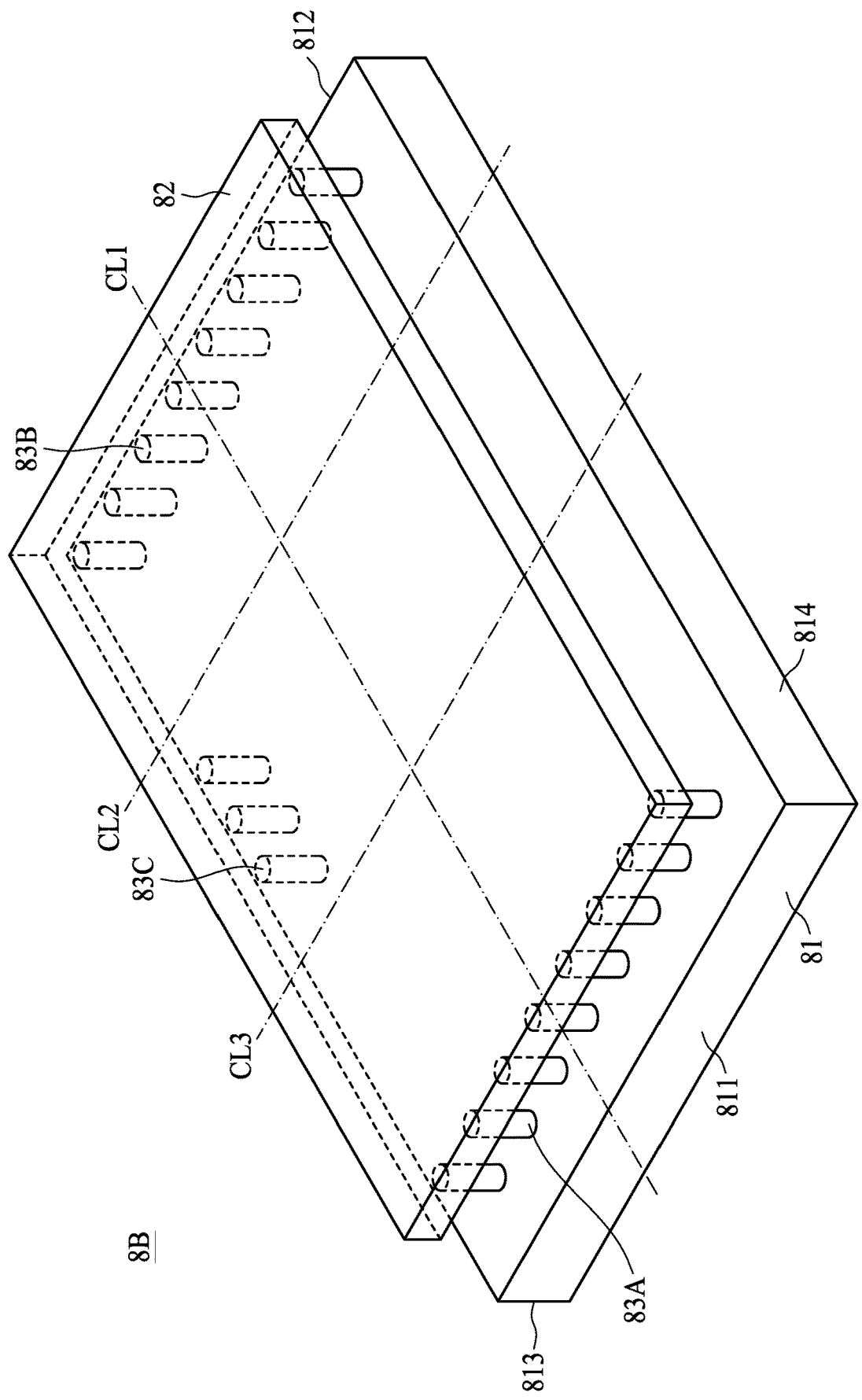
FIG. 8B illustrates a perspective view of a semiconductor device stack in accordance with yet still another embodiment of the present disclosure.

FIG. 8B illustrates a perspective view of a semiconductor device stack 8B in accordance with some embodiments of the present disclosure.

The semiconductor device stack 8B in FIG. 8B is similar to the semiconductor device stack 8A in FIG. 8A, and thus details of the structure of the stack 8B are not repeated here. A difference between the stack 8B in FIG. 8B and the stack 8A in FIG. 8A lies in that the semiconductor device stack 8B further includes a third row of supporters 83C. The third row of supporters 83C is mounted along the side 813 of the first carrier 81. The second row of supporters 83B extends in parallel with the scribing line CL1 and between the scribing lines CL2 and CL3.

Figure 8C:
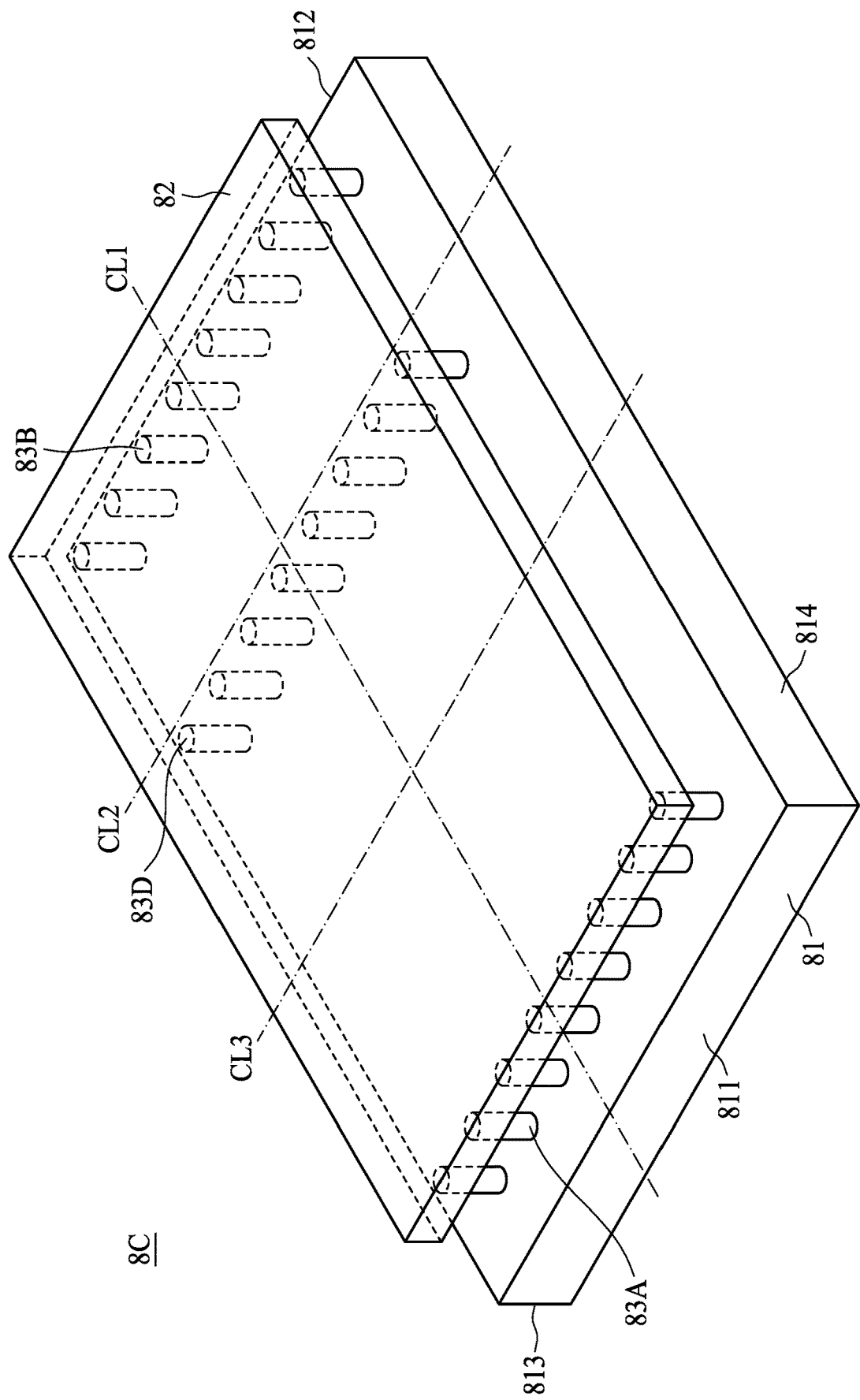
FIG. 8C illustrates a perspective view of a semiconductor device stack in accordance with still yet another embodiment of the present disclosure.

FIG. 8C illustrates a perspective view of a semiconductor device stack 8C in accordance with some embodiments of the present disclosure.

The semiconductor device stack 8C in FIG. 8C is similar to the semiconductor device stack 8A in FIG. 8A, and thus details of the structure of the stack 8C are not repeated here. A difference between the stack 8C in FIG. 8C and the stack 8A in FIG. 8A lies in that the semiconductor device stack 8C further includes a third row of supporters 83D. The third row of supporters 83D is mounted on the first carrier 81 along the scribing line CL2. The third row of supporters 83D extends in parallel with the scribing lines CL2 and CL3 and across the scribing line CL1. The first, second, and third row of supporters 83A, 83B, and 83D are not disposed on the scribing lines CL1, CL2 and CL3.

Figure 8D:
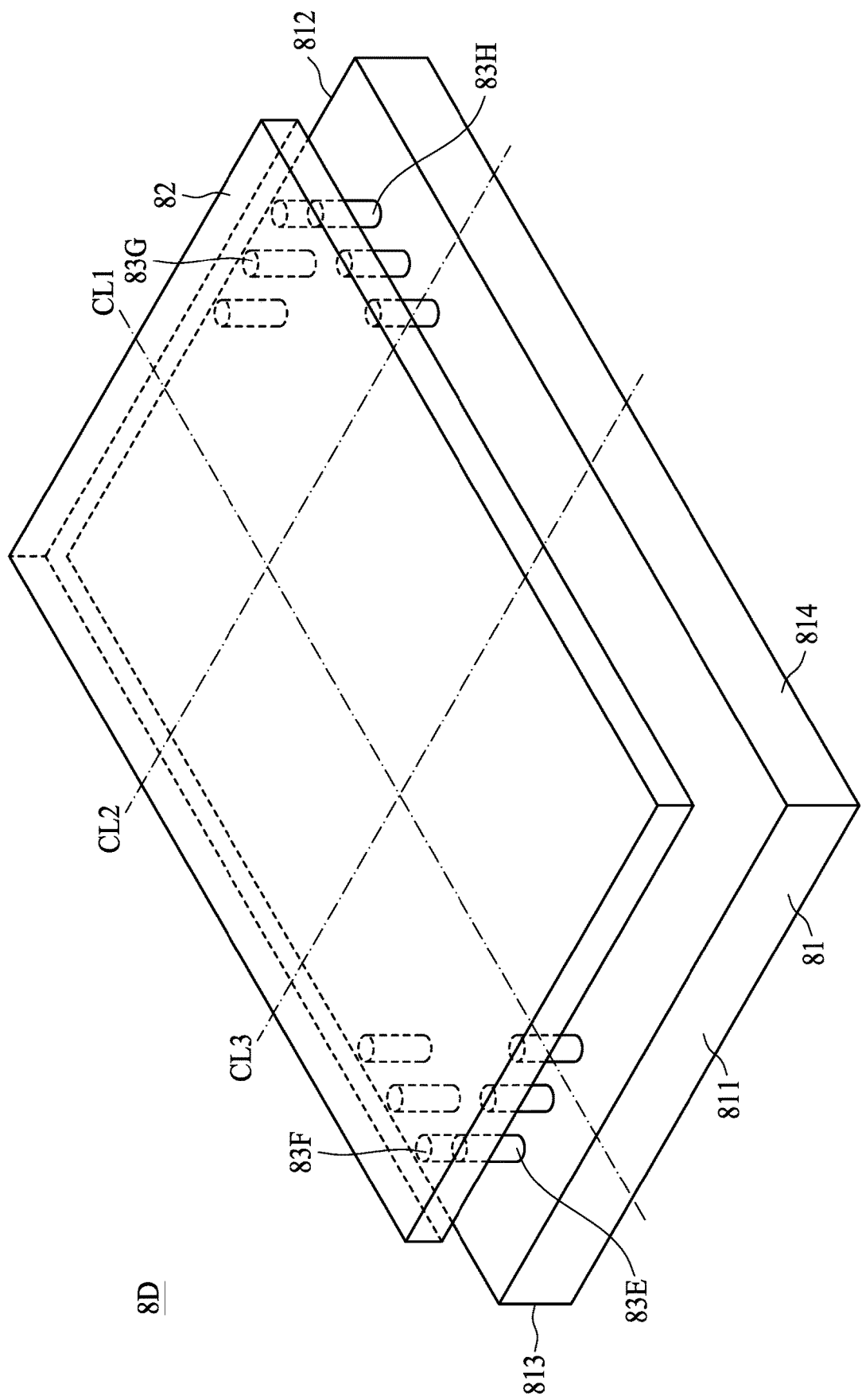
FIG. 8D illustrates a perspective view of a semiconductor device stack in accordance with some embodiments of the present disclosure.

FIG. 8D illustrates a perspective view of a semiconductor device stack 8D in accordance with some embodiments of the present disclosure.

The semiconductor device stack 8D includes a first carrier 81, a second carrier 82 and four rows of supporters 83E, 83F, 83G and 83H. The row of supporters 83E is mounted along the side 811 of the first carrier 81. The row of supporters 83E extends in parallel with the scribing lines CL2 and CL3. The row of supporters 83F is mounted along the side 813 of the first carrier 81. The row of supporters 83F extends in parallel with the scribing line CL1. The row of supporters 83G is mounted along the side 812 of the first carrier 81. The row of supporters 83G extends in parallel with the scribing lines CL2 and CL3 and not across the scribing line CL1. The row of supporters 83H is mounted along the side 814 of the first carrier 81. The row of supporters 83H extends in parallel with the scribing line CL1 and not across the scribing line CL2.

Please note that throughout the present disclosure the shape of the first and second carriers is not limited to a rectangle. The first and second carriers may have, for example, a circular or square shape. In addition, the supporters are not limited to a cylinder, and may have, for example, a cuboidal, cubic or spherical shape. The supporters may be conductive or non-conductive. The number of the supporters may be determined based on actual applications, as long as the supporters are spaced apart from the scribing line(s) and arranged, sub-carrier wise, asymmetrically with respect to the geographic center each of the first sub-carrier and the second sub-carrier.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a first substrate;
   a second substrate disposed over the first substrate;
   a first electronic component disposed under the second substrate;
   a second electronic component disposed over the first substrate;
   a third electronic component disposed over the first substrate, wherein a height of the third electronic component is greater than a distance between the first substrate and the second substrate, wherein a lateral surface of the second substrate is recessed from a lateral surface of the first substrate to define a recess portion, wherein the third electronic component is disposed in the recess portion; and
   a fourth electronic component disposed over the second substrate, wherein the fourth electronic component is disposed between the second electronic component and the third electronic component.

2. The semiconductor device package of claim 1, wherein the second electronic component is disposed between the first electronic component and the third electronic component.

3. The semiconductor device package of claim 1, wherein the first electronic component does not vertically overlap the second electronic component.

4. The semiconductor device package of claim 1, wherein a distance between the third electronic component and the second electronic component is greater than a distance between the third electronic component and the first electronic component.

5. The semiconductor device package of claim 1, further comprising an encapsulant encapsulating the third electronic component, wherein the third electronic component is accommodated in a space defined by a lateral surface of the encapsulant and a lateral surface of the second substrate, wherein the second substrate is outside the space.

6. The semiconductor device package of claim 5, wherein a distance between the third electronic component and a top surface of the encapsulant is greater than a distance between the third electronic component and the lateral surface of the encapsulant.

7. The semiconductor device package of claim 5, wherein a horizontal distance between the third electronic component and the lateral surface of the encapsulant is less than a horizontal distance between the third electronic component and the second substrate.

8. The semiconductor device package of claim 1, further comprising a supporter connecting the first substrate and the second substrate, wherein the supporter is disposed between the first electronic component and the third electronic component.

9. The semiconductor device package of claim 8, wherein a horizontal distance between the supporter and the third electronic component is less than a horizontal distance between the supporter and the first electronic component.

10. The semiconductor device package of claim 8, wherein a gap between a lateral surface of the supporter and a lateral surface of the second substrate is less than a gap between a lateral surface of the third electronic component and the lateral surface of the second substrate.

11. A semiconductor device package, comprising:
a first substrate;
a second substrate disposed over the first substrate;
a first electronic component disposed under the second substrate;
a second electronic component disposed over the first substrate; and
a third electronic component disposed over the first substrate, wherein a height of the third electronic component is greater than a distance between the first substrate and the second substrate, wherein a lateral surface of the second substrate is recessed from a lateral surface of the first substrate to define a recess portion, wherein the third electronic component is disposed in the recess portion; wherein an elevation difference between a top surface of the third electronic component and a top surface of the second substrate is less than a thickness of the second substrate.

12. The semiconductor device package of claim 11, wherein the elevation difference between the top surface of the third electronic component and the top surface of the second substrate is less than a distance between the first substrate and the second substrate.

13. The semiconductor device package of claim 11, wherein the elevation difference between the top surface of the third electronic component and the top surface of the second substrate is less than a horizontal distance between the third electronic component and the second substrate.

14. The semiconductor device package of claim 11, wherein two adjacent sides of the second substrate are substantially aligned with two adjacent sides of the first substrate.

15. The semiconductor device package of claim 14, wherein one side of the second substrate opposite to one of the two adjacent sides of the second substrate is substantially aligned with one side of the first substrate opposite to one of the two adjacent sides of the first substrate.

16. The semiconductor device package of claim 14, further comprising an encapsulant encapsulating the second substrate, wherein the two adjacent sides of the second substrate is exposed by the encapsulant.

17. The semiconductor device package of claim 11, further comprising a first row of supporters adjacent to a first side of the second substrate and a second row of supporters adjacent to a second side of the second substrate, wherein both the first row of supporters and the second row of supporters connect the first substrate and the second substrate, and a number of the first row of supporters is different from a number of second row of supporters.

18. The semiconductor device package of claim 17, wherein the first row of supporters are disposed at a periphery of the second substrate, wherein a gap between adjacent two of the first row of supporters is less than a gap between the first substrate and the second substrate.

19. The semiconductor device package of claim 11, wherein the first substrate has a first pad, the second substrate has a second pad, the semiconductor device package comprises a supporter connecting the first pad and the second pad, and a thickness of the supporter is greater than a thickness of the first pad or a thickness of the second pad.

* * * * *